United States Patent
Aschner et al.

(10) Patent No.: US 6,752,625 B1
(45) Date of Patent: Jun. 22, 2004

(54) METHOD AND APPARATUS DEVICE FOR THE HEAT TREATMENT OF SUBSTRATES

(75) Inventors: Helmut Aschner, Beimerstetten (DE); Patrick Schmid, Dornstadt (DE); Dieter Zernickel, Ulm (DE)

(73) Assignee: Steag RTP Systems GmbH (DE)

( * ) Notice: Subject to any disclaimer, the term of this patent is extended or adjusted under 35 U.S.C. 154(b) by 0 days.

(21) Appl. No.: 09/700,577

(22) PCT Filed: Apr. 30, 1999

(86) PCT No.: PCT/EP99/02942
§ 371 (c)(1),
(2), (4) Date: Nov. 13, 2000

(87) PCT Pub. No.: WO99/58733
PCT Pub. Date: Nov. 18, 1999

(30) Foreign Application Priority Data

May 11, 1998 (DE) .......................... 198 21 007

(51) Int. Cl.[7] .............................................. F27D 5/00
(52) U.S. Cl. .................... 432/253; 432/258; 118/728
(58) Field of Search .................. 432/253, 258, 432/259, 81; 211/41.18; 118/728, 729

(56) References Cited

U.S. PATENT DOCUMENTS

| | | |
|---|---|---|
| 4,698,486 A | 10/1987 | Sheets |
| 4,958,061 A | 9/1990 | Wakabayashi et al. |
| 5,044,943 A * | 9/1991 | Bowman et al. ............. 432/121 |
| 5,584,936 A * | 12/1996 | Pickering et al. ........... 118/728 |
| 5,683,518 A | 11/1997 | Moore et al. |
| 5,837,555 A * | 11/1998 | Kaltenbrunner et al. .... 438/796 |
| 6,022,412 A * | 2/2000 | Vincenzo et al. ........... 118/715 |
| 6,167,834 B1 * | 1/2001 | Wang et al. ............. 118/723 E |
| 6,214,122 B1 * | 4/2001 | Thompson et al. ......... 118/729 |

FOREIGN PATENT DOCUMENTS

| | | |
|---|---|---|
| DE | 36 27 598 C2 | 2/1988 |
| JP | 10-98048 | 4/1998 |
| WO | WO 97/06288 | 2/1997 |

OTHER PUBLICATIONS

International Search Report.

* cited by examiner

*Primary Examiner*—Gregory A. Wilson
(74) *Attorney, Agent, or Firm*—R W Becker & Associates; R W Becker

(57) ABSTRACT

The invention relates to a device and a method for the heat treatment of substrates, especially semiconductor wafers. The device comprises a reaction chamber with a compensation element. According to the invention the substrate can be inserted and withdrawn again more easily by the fact that the compensation element (15) can be at least partly lowered and/or raised in the reaction chamber.

12 Claims, 6 Drawing Sheets

US 6,752,625 B1

METHOD AND APPARATUS DEVICE FOR THE HEAT TREATMENT OF SUBSTRATES

BACKGROUND OF THE INVENTION

The present Invention relates to an apparatus for the thermal treatment of substrates, especially semi-conductor wafers, and includes a reaction chamber and a compensation element that surrounds the outer periphery of the substrate and is spaced therefrom. The present invention also relates to a method for the thermal treatment of substrates, especially semiconductor wafers, in a reaction chamber having a compensation element that surrounds the outer periphery of the substrate and is spaced therefrom.

A method and an apparatus of this type are described in DE 36 27 598 C. A compensation ring is provided about a wafer In a reaction chamber of the apparatus. During the thermal treatment of the wafer, the compensation ring prevents edge effects. With this ring, for example a more rapid heating up at the rim than at the inner region of the wafer during a heating-up phase, and a more rapid cooling off during a cooling-off phase, are avoided. Due to the compensation ring, temperature inhomogeneities within the wafer are thus eliminated or at least reduced. For a particularly good operation, the compensation ring is disposed essentially on the same plane as the wafer that is to be treated.

In the past, during the loading and unloading of the substrate that is to be handled, the compensation ring was grasped together with the substrate and introduced or withdrawn, since a handling device could freely grasp the wafer.

This common handling of wafer and compensation ring requires a complicated handling apparatus that in addition to a wafer-grasping apparatus must also have a compensation ring-grasping apparatus. Furthermore, due to the common handling there is an increased danger of damage to the compensation ring and/or to the wafer. U.S. Pat. No. 5,683,518, as well as JP 10-098 048, each disclose apparatus for the thermal treatment of substrates and have a reaction chamber and a compensation element, according to which during the thermal treatment the substrate rests upon the compensation element and is raised together with it in the reaction chamber. For loading and unloading, the substrates are placed upon posts that extend through the compensation element, with the respective compensation elements being completely lowered.

It is therefore an object of the present invention to provide a method and an apparatus for the thermal treatment of substrates that facilitate an introduction and withdrawal of the wafer into or out of the reaction chamber.

SUMMARY OF THE INVENTION

Proceeding from the initially mentioned apparatus, the stated objective is realized in that the compensation element is at least partially pivotable in the reaction chamber. By at least partially pivoting the compensation element in the reaction chamber, a direct access of a handling device to the wafer is possible, since the compensation element can be pivoted out of the access region of the handling device. In this connection, it is not absolutely necessary that the entire compensation element be pivoted; rather, it is sufficient to partially pivot the compensation element in order to enable free access to the wafer.

A pivot device is advantageously provided in the reaction chamber for the compensation ring or parts thereof, so that no such device has to be introduced from the outside.

Pursuant to one preferred specific embodiment of the invention, the pivot device is essentially spaced from the compensation element and is connected therewith by at least one connecting element. Spacing the pivot device from the compensation element ensures that the pivot device will exert no or only a slight thermal effect upon the compensation element.

The pivot device advantageously has a semi-circular member having an inner radius that is greater than the outer radius of the compensation element in order to influence the thermal treatment of the substrate as little as possible. For a simple construction of the pivot device, the free ends of the semi-circular member are mounted in the reaction chamber.

Pursuant to a further specific embodiment of the invention, the compensation element itself is pivotably mounted, resulting in a particularly straightforward pivotability.

Due to the typical shape of the substrates that are to be handled, the compensation element is preferably an annular or ring element. Pursuant to one specific embodiment, the compensation element comprises a plurality of segments in order to facilitate manufacture of the compensation element. This applies in particular for large substrates since the compensation element is typically made of the same material as the substrate and it is therefore difficult to manufacture the compensation element in the required size as one piece. The segments advantageously have angular segments of 60° each. For smaller substrates, as well as for compensation elements that are not made of the same material as are the substrates that are to be handled, the compensation element is preferably a single piece.

Pursuant to one particularly preferred specific embodiment of the present invention, the pivot device can be controlled by movement of a door of the reaction chamber, and especially automatically by the opening or closing of the chamber door. By automatic pivoting together with the movement of the chamber door, there results a particularly straightforward actuation mechanism. The automatic pivoting furthermore ensures that when the chamber door is opened, access to the wafer is provided.

Proceeding from the initially described method, the stated objective is also inventively realized in that the compensation element is pivoted at least partially in the reaction chamber in order to facilitate the insertion and/or removal of the substrate. This again results in the advantage that the access to the substrate is provided and it can therefore be introduced and removed without obstruction.

The compensation element is advantageously automatically pivoted by opening or closing the door of the reaction chamber. This automatically ensures that access is provided to the substrate when the chamber door is opened.

BRIEF DESCRIPTION OF THE DRAWING

The present invention will be subsequently explained with the aid of one preferred specific embodiment accompanied by reference to the drawing, in which.

DESCRIPTION OF PREFERRED EMBODIMENTS

Figure 1:
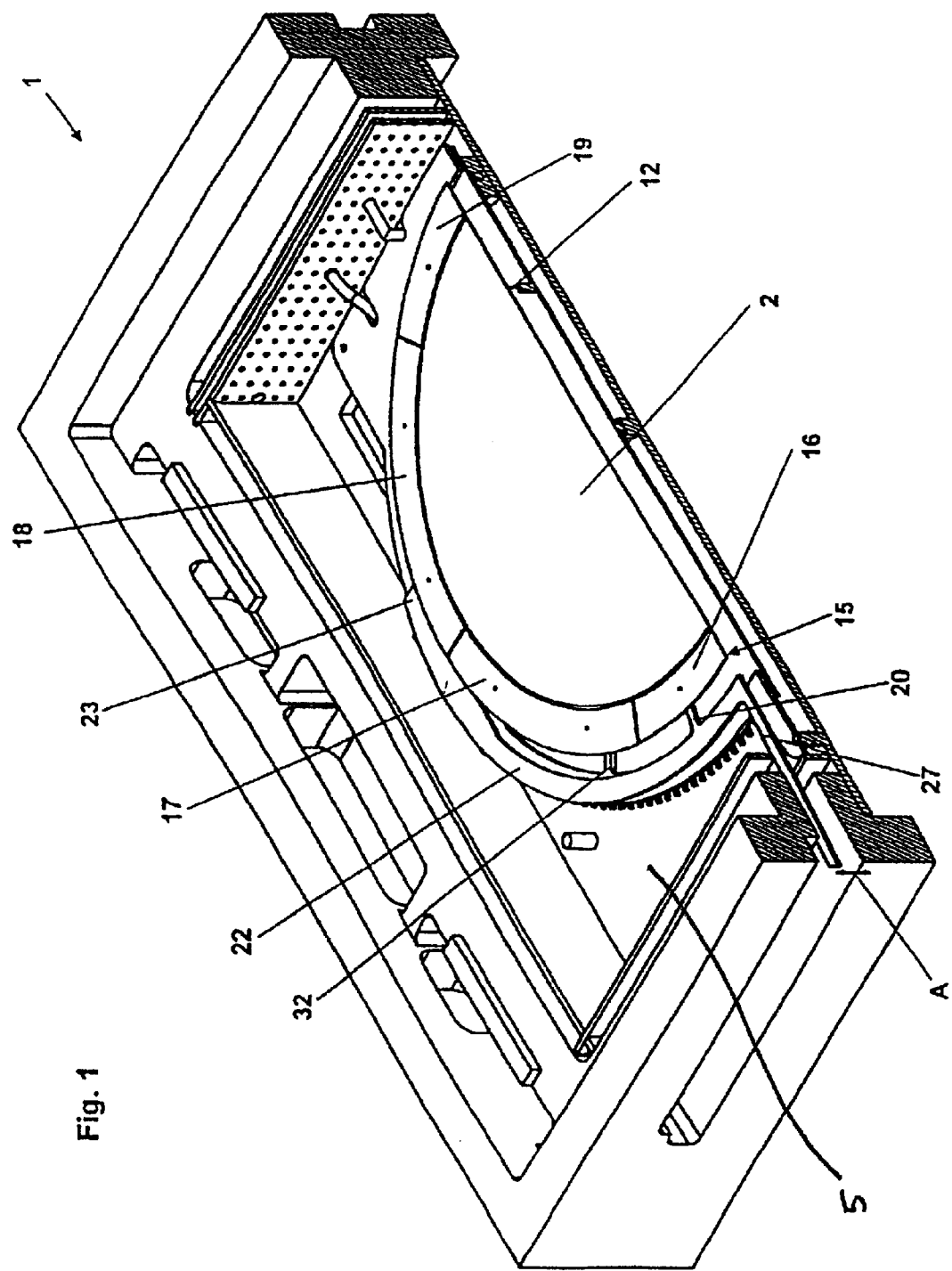
FIG. 1 is a partial cross-sectional perspective view of one apparatus for the thermal treatment of substrates, whereby for simplification of the drawing parts have been omitted.
Figure 2:
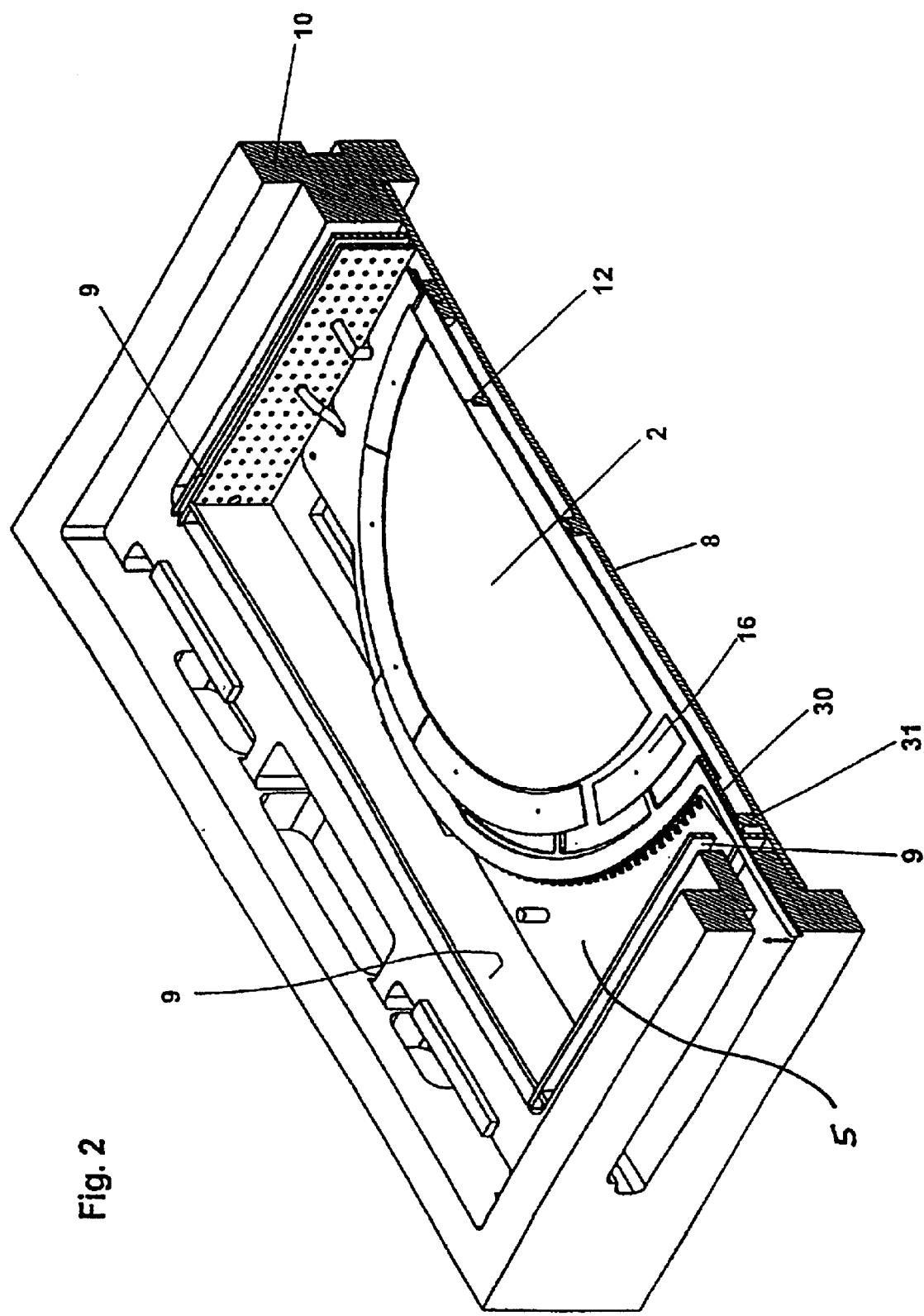
FIG. 2 is a view similar to that of FIG. 1, whereby an annular compensation element is illustrated in a lowered position.

FIGS. 1 and 2 show an apparatus 1 for the rapid thermal treatment of semiconductor wafers 2. The apparatus 1 is provided with a reaction chamber 5 that is formed by upper and lower quartz plates 7, 8 as well as lateral liner elements 9, which are all accommodated in a housing 10. Non-illustrated radiation sources are provided for heating the wafer 2.

Provided within the reaction chamber are a plurality of support elements 12 upon which the wafer 2 is placed. These support elements are disposed on a rotary plate 14 that is driven by a non-illustrated device for rotating the wafer.

Disposed about the outer periphery of the wafer 2 is an annular compensation element 15 that is divided into a plurality of segments 16, 17, 18, 19. In the illustrated embodiment, the annular segments 16, 17, 18, 19 are annular segments of 60° each, whereby the annular segments could also describe a greater or lesser angle. Although the compensation ring is illustrated as being segmented, it is also possible for the compensation ring to be one piece.

By means of a rib or leg 20, the annular segment 16 is connected to an essentially semi-circular, pivotable raising and lowering element 22, the free end of which, as indicated at 25, is pivotably mounted in the reaction chamber. A control lever 27 extends from the pivotable raising and lowering element 22 to an insertion/withdrawal opening in the housing 10. This lever is in contact with a non-illustrated door of the reaction chamber, and is lowered or raised by opening and closing the door, as indicated by the double arrow A.

Those annular segments 17, 18, 19 that are not associated with the pivotable raising and lowering element 22 rest upon an annular support element 30 that is supported upon at least one projection 31 of the lower quartz plate 8 and by means of ribs 32 holds the annular segments stationarily in the reaction chamber. The support element 30 is spaced from the rotary plate 14, so that the annular segments 17, 18, 19 remain stationary during rotation of the wafer 2.

Figure 3:
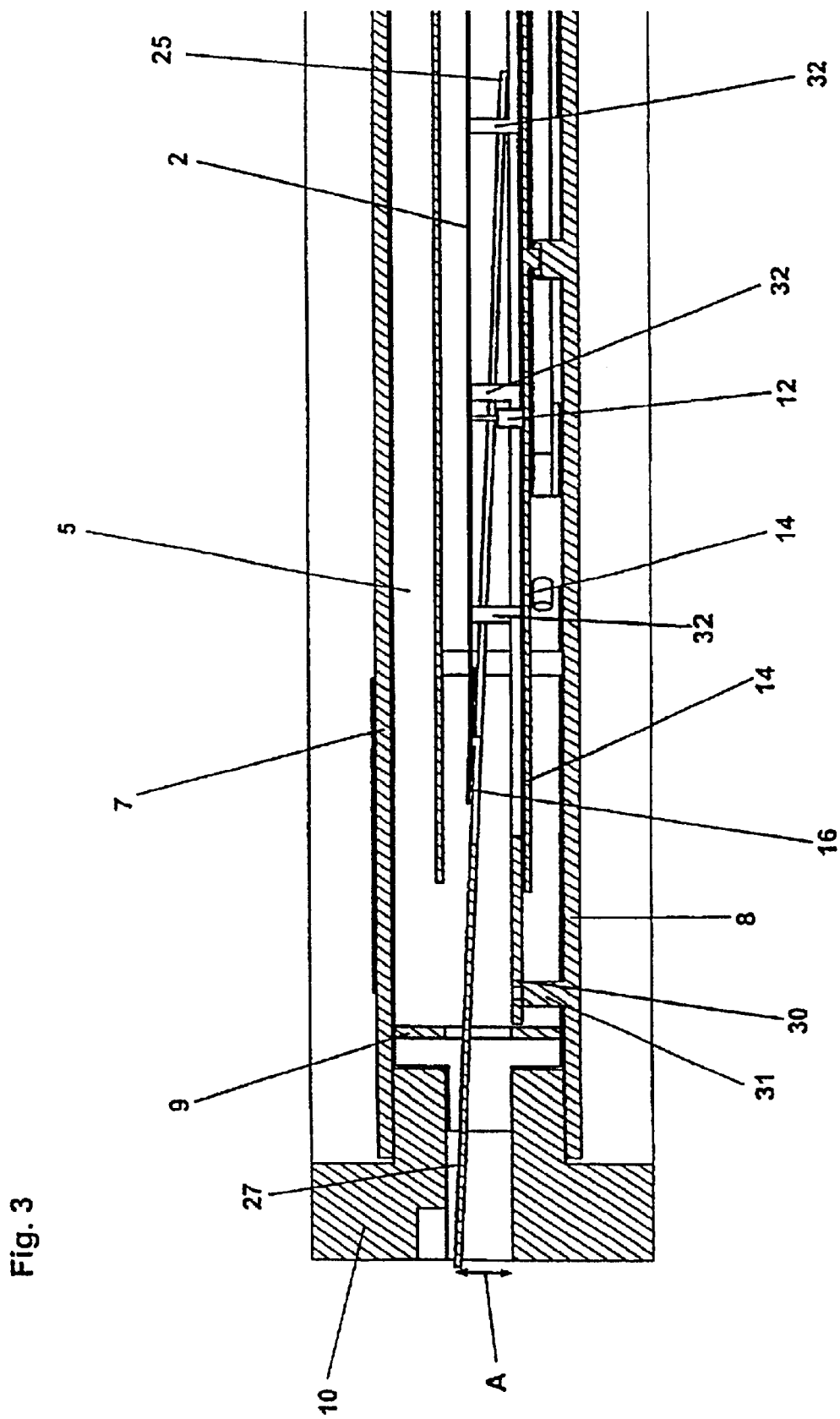
FIG. 3 is a partial cross-sectional view through an apparatus according to FIG. 1 having a raised annular compensation position.
Figure 4:
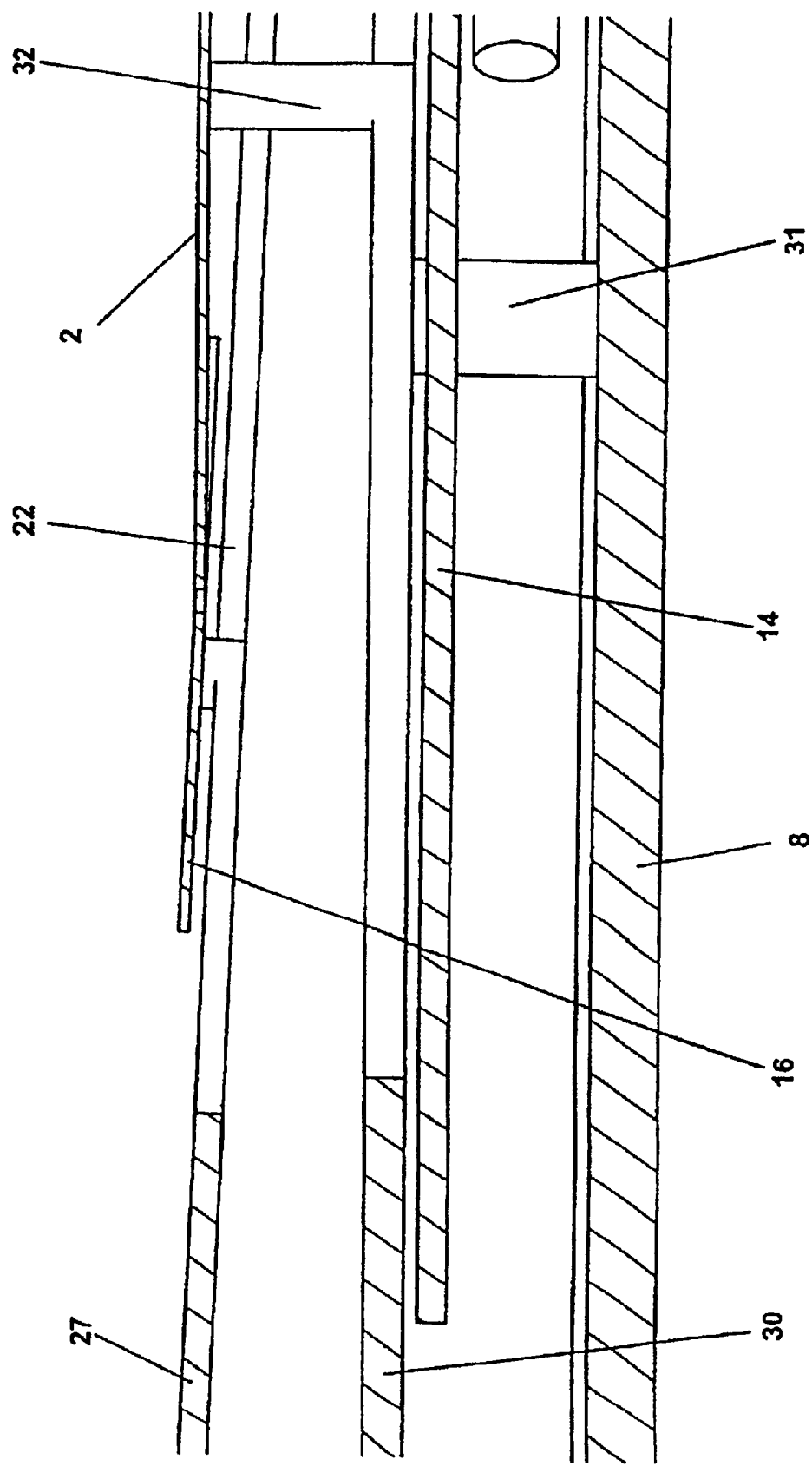
FIG. 4 is an enlarged detailed sectional view that shows the annular compensation segment in a raised segment.
Figure 5:
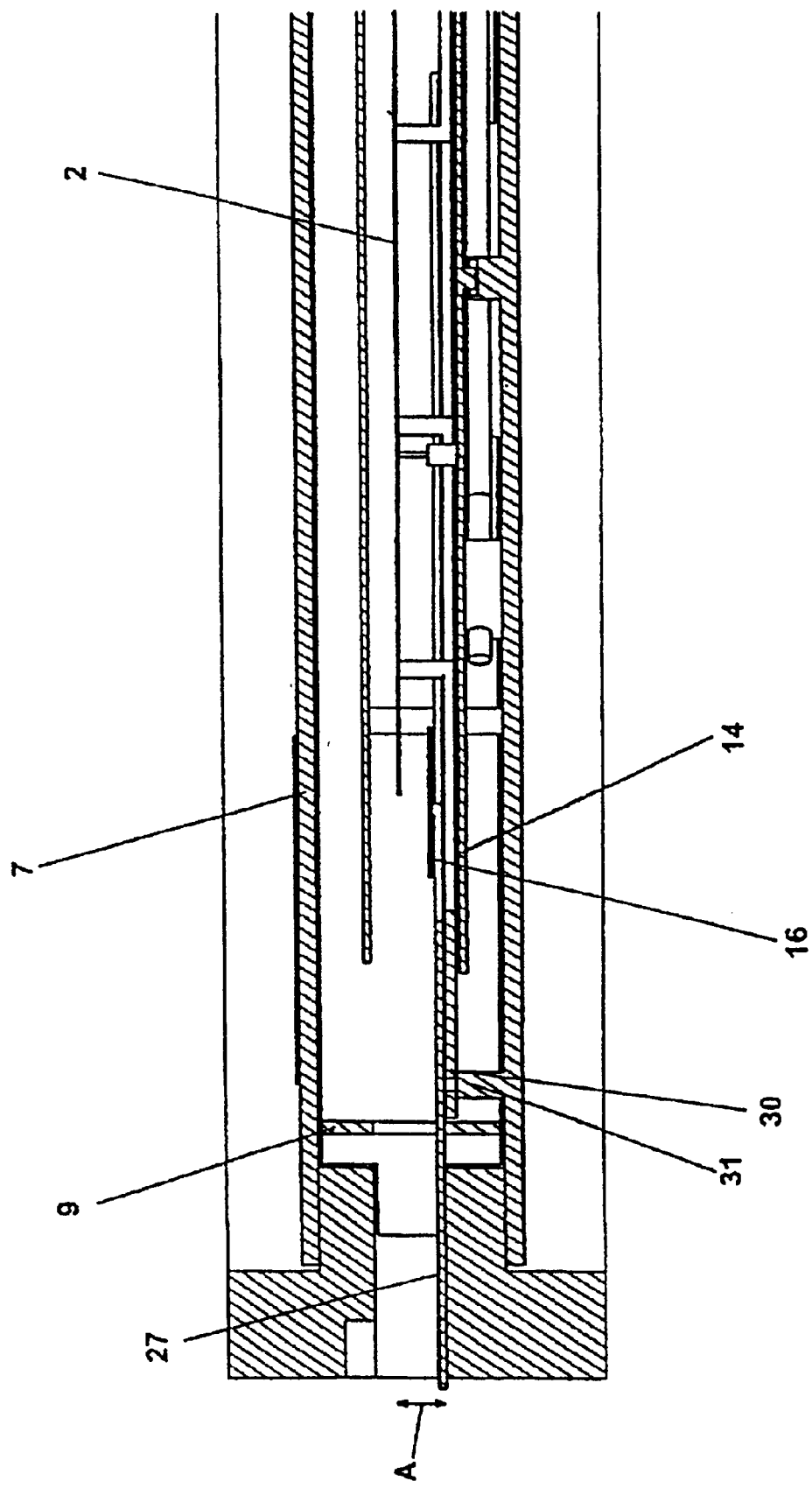
FIG. 5 is a cross-sectional view similar to that of FIG. 3, whereby the annular compensation segment is shown in a lowered position.
Figure 6:
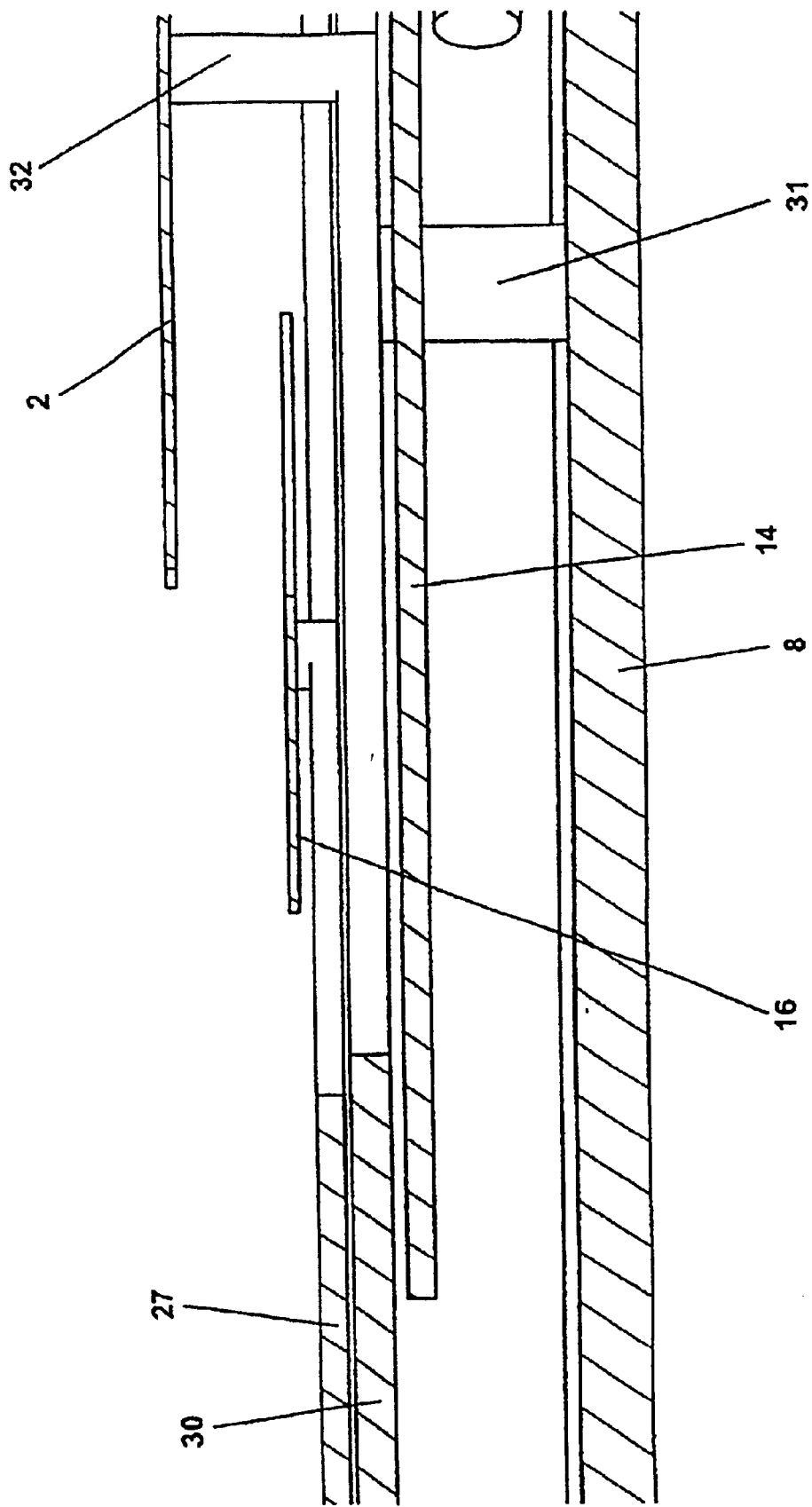
FIG. 6 is an enlarged detailed sectional view showing the annular compensation segment in a lowered position.

For the thermal treatment, the wafer 2 is introduced by a non-illustrated handling device into the reaction chamber 5 and is placed upon the support elements 12. To introduce the wafer 2, the annular segment is lowered, by pivoting, via the pivotable raising and lowering element 22, as can be seen from FIGS. 2, 5 and 6, in order to expose the movement region of the handling device. The pivoting of the raising and lowering element 22 is effected automatically by opening the non-illustrated door of the reaction chamber, which transfers the opening movement via the control lever 22 to the raising and lowering element 22. After placement of the wafer 2 upon the support elements 12, the handling device is withdrawn from the reaction chamber and the reaction chamber door is closed, as a result of which the control lever 22, the raising and lowering element 22, and hence the annular segment 16 are moved into the position shown in FIGS. 1, 3 and 4. In this position, the annular segment 16, together with the other annular segments 17, 18, 19, forms an essentially closed compensation ring about the wafer 2.

In this position, the wafer 2 is subjected to the thermal treatment. During withdrawal of the wafer from the reaction chamber 5, the previous process is reversed. By opening the reaction chamber door, the annular segment 16 is lowered, as a consequence of which access by the handling device to the wafer 2 is provided. The handling device grasps the wafer 2 and withdraws it from the reaction chamber 5. A new wafer 2 can then be introduced into the reaction chamber as described above.

The invention was previously described with the aid of one preferred specific embodiment. However, embodiments, modifications and variations are possible to one skilled in the art without thereby departing from the inventive concept. In particular, it is possible to differently embody the pivotable raising and lowering element 22 and the control lever 27, or to provide a different activation for these elements. As already indicated, it is also not necessary for the compensation ring 15 to be segmented. It is also possible to pivotably mount the compensation ring 15 or its segments in the reaction chamber without the use of a pivotable raising and lowering element, as a result of which a separate raising and lowering element can be eliminated and only a single control element for a pivoting of the compensation element 15 itself would be required.

The specification incorporates by reference the disclosure of German priority document 19821 007.8 of May 11, 1998 and the International priority document PCT/DE99/02942of Apr. 30, 1999.

The present invention is, of course, in no way restricted to the specific disclosure of the specification and drawings, but also encompasses any modifications within the scope of the appended claims.

What we claim is:

1. An apparatus for the thermal treatment of substrates, comprising:
   a housing having a reaction chamber; and
   a temperature-compensating element disposed in said reaction chamber for surrounding an outer periphery of a substrate, wherein said compensating element is spaced from said substrate and is essentially disposed in the plane of said substrate, wherein said compensating element is at least partially pivotable in said reaction chamber relative to said plane of said substrate,
   wherein a pivot device is disposed in said reaction chamber.

2. An apparatus according to claim 1, wherein said pivot device is essentially spaced from said compensating element, and wherein at least one connection element is provided for interconnecting said pivot device and said compensating element.

3. An apparatus according claim 2, wherein said compensating element is pivotably mounted in said reaction chamber.

4. An apparatus according to claim 2, wherein said reaction chamber has a door, and wherein said pivot device is actuateable by movement of said chamber door.

5. An apparatus according to claim 4, wherein said pivot device is automatically pivotable by opening or closing of said chamber door.

6. An apparatus according to claim 2, wherein said compensating element is an annular element.

7. An apparatus according to claim 2, wherein said compensating element comprises a plurality of segments.

8. An apparatus according to claim 7, wherein said segments each have an annular segment of 60°.

9. An apparatus according claim 1, wherein said pivot device is provided with a semi-circular member that has an inner radius that is greater than an outer radius of said substrate.

10. An apparatus according to claim 9, wherein said semi-circular member has free ends that are pivotable mounted in said reaction chamber.

11. A method for the thermal treatment of substrates in a reaction chamber having a compensation element that surrounds an outer periphery of a substrate and is spaced therefrom, wherein said compensation element is essentially disposed in the plane of said substrate, said method including the step of:

at least partially pivoting said compensation element in said reaction chamber relative to said plane of said substrate for providing a lateral access to said substrate for introducing or withdrawing said substrate.

12. A method according to claim 11, which includes the step of automatically pivoting said compensation element by opening or closing a door of said reaction chamber.

* * * * *

UNITED STATES PATENT AND TRADEMARK OFFICE
CERTIFICATE OF CORRECTION

PATENT NO. : 6,752,625 B1 Page 1 of 1
DATED : June 22, 2004
INVENTOR(S) : Aschner et al.

It is certified that error appears in the above-identified patent and that said Letters Patent is hereby corrected as shown below:

Title page,
Item [54], should read as follows:

-- [54] Title: METHOD AND APPARATUS FOR THE THERMAL TREATMENT OF SUBSTRATES --

Signed and Sealed this

Twenty-third Day of November, 2004

JON W. DUDAS
*Director of the United States Patent and Trademark Office*